United States Patent [19]
Morse

[11] 3,941,916
[45] Mar. 2, 1976

[54] ELECTRONIC CIRCUIT PACKAGE AND METHOD OF BRAZING

[75] Inventor: Robert Spitler Morse, La Mesa, Calif.

[73] Assignee: Burroughs Corporation, Detroit, Mich.

[22] Filed: Dec. 26, 1974

[21] Appl. No.: 536,443

[52] U.S. Cl............. 174/52 FP; 29/626; 174/50.61; 228/122; 317/101 CM; 317/101 CP
[51] Int. Cl.² .......................................... H05K 5/00
[58] Field of Search............ 174/68.5, 52 FP, 52 H, 174/50.61; 228/121, 122, 123; 29/626, 504, 472.9, 473.1; 403/177; 52/759

[56] References Cited
UNITED STATES PATENTS

| | | | |
|---|---|---|---|
| 3,136,667 | 7/1964 | Knauf, Jr. et al............... | 228/122 X |
| 3,205,298 | 9/1965 | Kalt........................... | 174/52 FP UX |
| 3,312,771 | 4/1967 | Hessinger et al................ | 174/52 FP |
| 3,385,618 | 5/1968 | Hargis......................... | 174/50.61 X |
| 3,404,215 | 10/1968 | Burks et al..................... | 174/52 FP |
| 3,634,600 | 1/1972 | Griffin et al.................... | 174/52 FP |
| 3,638,304 | 2/1972 | Bleil.......................... | 29/626 |
| 3,862,488 | 1/1975 | Pessell et al.................... | 228/122 |

*Primary Examiner*—Darrell L. Clay
*Attorney, Agent, or Firm*—Larry Michael Jarvis; William B. Penn; Kevin R. Peterson

[57] ABSTRACT

An electronic package assembly having a plurality of gold-plated lead pins solderably secured within a corresponding array of pre-metalized, cylindrical-shaped holes disposed in a ceramic substrate of the package. The interior surfaces defining the holes are pre-metalized with a layer of palladium-silver followed by a layer of gold. The pins are then brazed to the metalized hole interiors with a gold germanium filler metal which has been screen printed on the upper surface of the substrate in ring configurations outlining the pin receiving holes.

7 Claims, 6 Drawing Figures

ELECTRONIC CIRCUIT PACKAGE AND METHOD OF BRAZING

BACKGROUND OF THE INVENTION

1. Field of the Invention

The invention relates to an electronic package assembly of the type having an encapsulated electronic device, and also to methods for assemblying such packages. More particularly, the invention relates to the securement of pre-plated electrical lead pins to the ceramic substrate of such an electronic package assembly.

2. Description of the Prior Art

It is well known to construct electronic package assemblies from a ceramic substrate having a central cavity in which a semiconductor chip is mounted. The substrate contains an array of holes with each hole receiving an electrical lead pin. The lead pins are secured in the package and a conductive pattern of leads printed on the surface of the substrate electrically interconnects the pins to the semiconductor device. The semiconductor device is often attached in the cavity by means of a gold glass frit paste, commonly referred to as a die attach pad, following which the package is sealed by application of a metal cap enclosing the central cavity to protect the chip against conductive air borne contaminates and other adverse environmental conditions which affect the operating characteristics of the device. Such chip attachment and encapsulation are usually one of the final steps in the package manufacture, taking place after electrical lead pins are secured in the package.

Heretofore, lead pins formed from "Kovar" or similar alloy, were bonded to the ceramic substrate by a copper-silver eutectic braze. The use of copper-silver as a filler alloy between the pins and the ceramic substrate necessitated the brazing operation to be conducted at 780°C. After the pins were secured to the substrate, the lead pattern and pins were plated with a corrosion resistant material, such as gold.

To facilitate the fabrication of such electronic package assemblies and to reduce the cost factor in the prior modes of assembly, it became desirable to eliminate the subsequent step of gold plating the package, by gold plating the lead pins prior to securing the same to the package. However, the use of pre-plated lead pins requires a brazing operation under 600°C. to prevent the gold plating from diffusing into the Kovar-composed pins. But with pin-to-ceramic bonds formed at lower temperatures, problems arise due to the high temperature requisite for subsequent chip attachment within the central cavity. Such high temperatures will degrade the strength and reliability of these low-temperature-formed bonds and could possibly melt such bonds, releasing many of the pins before the chip is attached.

The discovery of a method to braze pre-goldplated pins within a ceramic substrate of an electronic package while still maintaining the integrity of the lead pin bonds during chip attachment has been the subject of continued search in the electronic device art.

SUMMARY OF THE INVENTION

It is, therefore, an object of the invention to secure pre-plated electrical lead pins to the ceramic base of an electronic package such that the attachment interface formed therebetween will not reflow during subsequent package heating operations.

It is another object of this invention to provide a method for brazing electrical lead pins to a ceramic substrate of an electronic package at a relatively low brazing temperature.

It is a more specific object of this invention to provide an electronic package assembly of the type having a metal alloy bond formed between electrical lead pins and the ceramic substrate of the package, which bond will not reflow at temperatures under 500°C.

The objectives of the invention are accomplished in the use of a gold germanium solder paste for securing electrical lead pins to a ceramic base layer of an electronic package assembly. The solder paste is screen printed in ring configurations on the upper surface of the ceramic base, with each ring bordering the periphery of each of a plurality of pin-receiving holes. The interior surfaces defining the holes are plated with a palladium-silver layer followed by a gold layer. Gold-plated pins are inserted into the holes, with one end of each pin disposed flush with the upper surface of its corresponding solder ring. During a brazing operation at 525°C., the solder paste combines with the gold-plated pins and the metalized hole interiors to form an alloy bond incapable of reflowing at temperatures below 500°C.

Other objects and advantages of the invention will become more fully apparent from the following detailed description of the preferred embodiment taken in conjunction withe the appended claims and accompanying drawings.

DESCRIPTION OF THE PREFERRED EMBODIMENT

Figure 1:
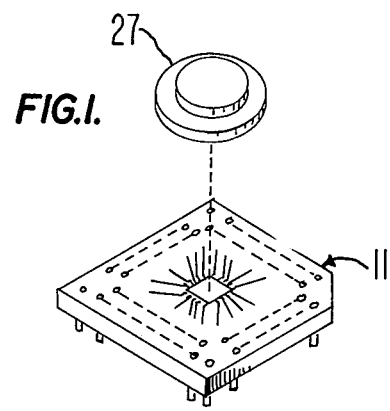
FIG. 1 is a perspective view of the electronic package assembly of the present invention.
Figure 2:
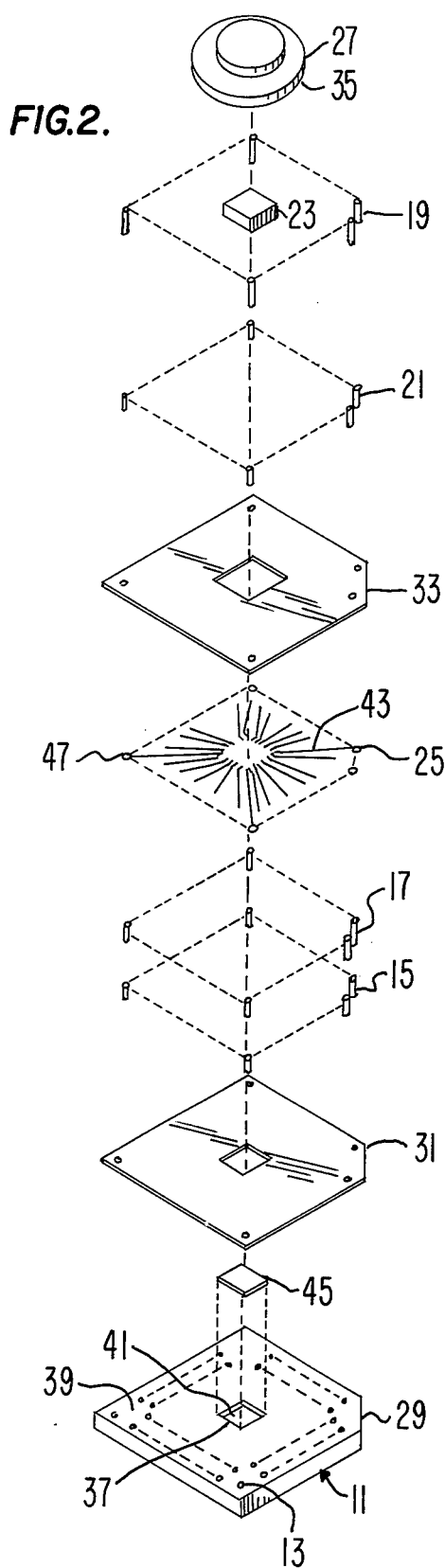
FIG. 2 is an exploded perspective view of the electronic package assembly of FIG. 1.

As illustrated in FIGS. 1 and 2, the electronic package of the present invention is constructed from a flat, rectangular, ceramic base layer 11 having an encapsulating cavity 37 centrally located in the upper surface 39 of the base layer 11. The cavity 37 has a horizontal bottom surface 41 for mountably receiving a planar electronic device 23 such as a monolithic semiconductor integrated circuit chip. The electronic device 23 is bonded within the cavity 37 by means of a gold glass frit paste 45, painted on the bottom surface of the central cavity.

The ceramic layer 11 includes an array of cylindrical shaped holes 13, extending completely therethrough for receiving a corresponding plurality of electrical lead pins 19 which may be made from "Kovar" or similar alloy. Because ceramic is inherently difficult to wet with conventional brazing fillers, the interior surfaces of the holes 13 are metalized first with a liner of palladium-silver 15 and then with a liner of gold 17. The palladium-silver integrally adheres to the ceramic layer, serving as a base for supporting the metalized liner of gold 17. Such metalizations may be accomplished by screen printing or other known techniques in the art. Because the palladium-silver serves as a supporting layer, the percentage of palladium present in the palladium silver has been found to be noncritical and a wide range of percentages may be used; however, 20% palladium is operatively satisfactory.

A glass layer 31 is screen printed onto the upper surface 39 of the ceramic substrate 11 excluding the central cavity area and pin receiving apertures which are masked during screen printing according to conventional practices. The glass layer 31 provides a desirable stratum for having printed thereon an electrical lead pattern 25 which electrically interconnects the metalized pin receiving holes 13 with the electronic device 23. The lead pattern 25 comprises a multiplicity of laterally spaced gold stripes 43 radiating from the central cavity 37 and ending in enlarged portions 47 through which individual pin-receiving holes are formed. A glass layer 33 is superimposed onto the pattern 25 to electrically insulate the stripes 43 from loose foreign conductive particles.

The pin-receiving holes and central cavity are masked somewhat larger than their surface dimensions from application of the glass layers 31, 33. The masking permits the interior ends of the leads 43 to be free from insulation to accomodate proper connection of the leads to the semiconductor device 23 via small whisker-like wires in accordance with well-understood bonding techniques. Also, the exterior ends of the leads are masked free from insulation to facilitate electrical interconnection of the leads to the pins during metallurgical securement of the pins to the ceramic layer 11.

A gold germanium paste 21 is utilized to solderably join each electrical lead pin to its respective pin receiving hole. The solder paste is composed of approximately 88% gold and 12% germanium by weight and has a melting temperature of approximately 356°C. The gold germanium paste flows readily and can be used as a solder filler metal in small joint clearances.

Figure 3:
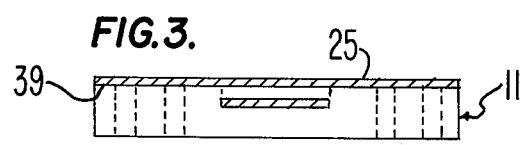
FIGS. 3–3C show a series of lateral views, illustrating the assembling steps of the electronic package assembly of FIG. 1.

Referring to FIG. 3, the solder paste 21 is screen printed in ring configurations on the upper surface 39 of the ceramic base 11, with each ring 21 contiguous to and bordering the periphery of each of the plurality of pin receiving holes 13. The amount of paste collaring each hole approximates a radial thickness of a lead pin radius.

The positioning of the paste is such to permit the paste to flow into the joint clearances between the pins and plated holes during brazing. Thus, shaping or grooving of the ceramic layer, and certain types of capillary attraction could possibly be used to direct the paste's flow.

Gold-plated lead pins 19 are next inserted in close clearance relation into the plated holes 13. The pins 19 are disposed with one end of each pin nearly flush with the upper surface of its corresponding solder ring 21.

The package then undergoes a heating operation in a neutral atmosphere of nitrogen, at 525°C. The gold germanium melts quickly flowing into the joint clearances between the pins and plated holes, wetting the pure gold of the pins and the pure gold of the hole interiors to form an alloy joint securing the pins 19 to the ceramic substrate 11. Due to the relative diffusement of atoms between the pure gold and gold germanium solder paste, the alloy remaining in the joint will have a re-melt temperature above 500°C. The alloy joint also provides electrical continuity between a respective lead pin 19 and its corresponding lead stripe 43.

With the pins 19 securely mounted to the package, the semiconductor chip 23 is bonded to the bottom surface of the central cavity by means of the gold glass frit paste 45, air fired at 420°C. Finally, a cap 27 is sealed to the glass layer 33 by a layer of epoxy 35 placed around the outer edge of the cap before being set into position.

Figure 3A:
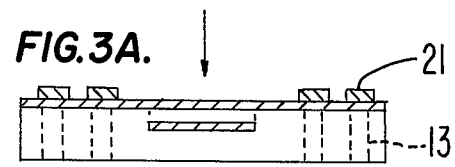
Figure 3B:
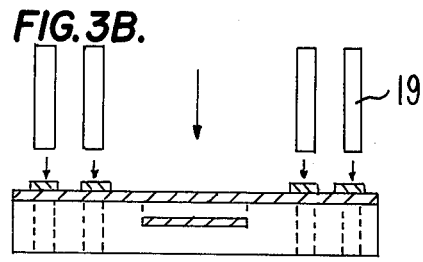
Figure 3C:
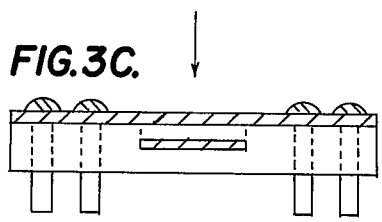

The method of assembling the package will be quite evident from the foregoing. FIGS. 3–3C illustrate the preferred sequence of steps in the assembly of the package: FIG. 3 shows the lead pattern, glass layers, gold cavity-paste, palladium-silver hole-linings and gold hole-linings disposed on the ceramic substrate; FIG. 3A shows the subsequent screen printing of the gold germanium solder paste; FIG. 3B shows the next step of pin insertion; and FIG. 3C illustrates the brazing of the package.

From the foregoing it can be seen that the present invention provides an encapsulated electronic package assembly having dependable lead pin to ceramic base bonds. Similarly, other discrete objects such as metal caps, flanges, and the like, could be secured to the ceramic layer in a similar fashion. It should be understood, of course, that the foregoing disclosure relates to a preferred embodiment of the invention and that numerous modifications or alterations may be made therein without departing from the spirit or scope of the invention as set forth in the appended claims.

What is claimed is:

1. A method of affixing gold-plated electrical lead pins within pin receiving holes disposed in a ceramic layer of an electronic package assembly comprising the steps of:
   depositing palladium-silver on the interior surfaces defining the holes;
   depositing gold on said palladium-silver;
   positioning a plurality of gold-plated pins within the holes; and
   brazing the gold-plated pins within the holes with a gold-germanium solder.

2. In the art of manufacturing electronic device packages comprising a ceramic layer having a plurality of electrical lead pin receiving holes extending therethrough, the method of affixing gold-plated lead pins within the ceramic layer, comprising the steps of:
   interiorly plating each of the holes with palladium-silver;
   interiorly plating each of the palladium-silver lined holes with gold;
   depositing a gold germanium solder paste having flow characteristics when heated, on one surface of the layer, and being positioned to flow into each of the holes when heated;
   positioning a plurality of gold-plated pins within the holes; and
   heating at least the area surrounding the holes including said solder paste causing the brazing of the gold-plated pins to the gold plating on the holes with said solder paste.

3. In the art of manufacturing electronic device packages comprising a ceramic layer having a plurality of electrical lead pin receiving holes extending therethrough, the method of affixing gold-plated lead pins within the ceramic layer, comprising the steps of:
   interiorly metalizing each of the holes with palladium-silver;
   interiorly metalizing each of the palladium-silver lined holes with gold;
   screen printing a gold germanium solder paste in ring shape configurations on one surface of said layer, each configuration of solder paste contiguous to and bordering the periphery of each of the holes;

positioning a plurality of gold-plated pins within respective holes and to contact said solder paste; and heating at least the area surrounding the holes in an inert atmosphere of nitrogen causing the brazing of the pins to said gold disposed on said palladium-silver lined holes with said solder paste.

4. The method of affixing gold-plated lead pins within a ceramic layer as recited in claim 3 wherein, the solder paste screen printed on said layer is formed of substantially 88% gold and 12% germanium by weight.

5. In the art of manufacturing electronic device packages comprising a ceramic layer, the method of solderably joining a discrete object to the ceramic layer, comprising the steps of:

metalizing palladium-silver on an area of a ceramic layer where a joining is to occur;

metalizing the palladium-silver area with gold;

gold plating a discrete object in an area to be joined to the ceramic layer;

disposing said gold-plated area of the discrete object in proximity of said metalized area of the ceramic layer for joining to occur by brazing; and brazing the gold on the discrete object to the gold on the ceramic layer, with a gold-geranium solder.

6. An electronic device package comprising:

a ceramic layer having opposing surfaces with a plurality of holes communicating with said surfaces;

an electronic device mounted on one of said surfaces of said layer;

an array of electrical leads overlying said one of said surfaces of said layer, one end of each lead communicating with a respective hole and the other end of each lead electrically interconnected to said electronic device;

a plurality of electrical lead pins, each pin being disposed in one of said holes; and a metallurgical joint integrally securing each of said pins to the ceramic layer, said joint comprising: a palladium-silver layer metalized on the surfaces defining said holes; a gold layer metalized on said palladium-silver layer; a gold layer plated on said pins; and a brazed joint joining both of said gold layers, said brazed joint formed of a gold-germanium filler metal.

7. An electronic device package comprising:

a ceramic layer having opposing surfaces with a plurality of holes communicating said surfaces;

an electronic device mounted on one of said surfaces of said layer;

an array of electrical leads overlying said one of said surfaces of said layer, one end of each lead communicating with a respective hole and the other end of each lead electrically interconnected to said electronic device;

a plurality of electrical lead pins, each pin being disposed in one of said holes; and a metallurgical joint integrally securing each of said pins to the ceramic layer, said joint comprising:

1. a metal layer metalized on the surfaces defining said holes;
2. a gold layer metalized on said metal layer;
3. a gold layer plated on said pins; and
4. a brazed joint solderably joining both of said gold layers, said brazed joint formed of a gold germanium filler metal.

* * * * *